United States Patent
Oh et al.

(10) Patent No.: US 9,171,859 B2
(45) Date of Patent: Oct. 27, 2015

(54) SEMICONDUCTOR DEVICE AND METHOD OF MANUFACTURING THE SAME

(71) Applicant: SK hynix Inc., Icheon-si Gyeonggi-do (KR)

(72) Inventors: Sung Lae Oh, Cheongju-si (KR); Jin Ho Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/317,253

(22) Filed: Jun. 27, 2014

(65) Prior Publication Data

US 2015/0206895 A1    Jul. 23, 2015

(30) Foreign Application Priority Data

Jan. 23, 2014  (KR) .......................... 10-2014-0008260

(51) Int. Cl.
    *H01L 27/112*    (2006.01)
    *H01L 27/115*    (2006.01)
    *H01L 23/528*    (2006.01)

(52) U.S. Cl.
    CPC ........ *H01L 27/11568* (2013.01); *H01L 23/528* (2013.01); *H01L 23/5283* (2013.01); *H01L 27/1157* (2013.01); *H01L 27/11578* (2013.01)

(58) Field of Classification Search
    None
    See application file for complete search history.

(56) References Cited

U.S. PATENT DOCUMENTS

| | | | | |
|---|---|---|---|---|
| 8,178,917 | B2* | 5/2012 | Tanaka et al. ................ | 257/324 |
| 8,569,182 | B2* | 10/2013 | Park et al. .................... | 438/738 |
| 2010/0013049 | A1* | 1/2010 | Tanaka et al. ................ | 257/532 |
| 2013/0044531 | A1* | 2/2013 | Baek et al. ..................... | 365/72 |
| 2014/0226414 | A1* | 8/2014 | Costa et al. ............... | 365/185.22 |
| 2014/0254231 | A1* | 9/2014 | Cernea et al. ................ | 365/63 |

FOREIGN PATENT DOCUMENTS

| | | |
|---|---|---|
| KR | 1020100123462 A | 11/2010 |
| KR | 101212709 B1 | 12/2012 |

OTHER PUBLICATIONS

Ou, E. Array Architecture for Nonvolatile 3 Dimensional Cross-Point Memory. Thesis. Stanford University, 2010. Stanford: Deparment of Electrical Engneeing, 2010.*

* cited by examiner

*Primary Examiner* — Joseph Schoenholtz
(74) *Attorney, Agent, or Firm* — William Park & Associates Ltd.

(57) ABSTRACT

A semiconductor device may include interlayer insulating patterns and local word lines which are alternately stacked to form a stepped structure, and a first insulating layer formed on a surface of the stepped structure. The semiconductor device may also include a word line selection gate formed along a surface of the first insulating layer, and active patterns passing through the word line selection gate and the first insulating layer, and connected to the local word lines, respectively.

15 Claims, 9 Drawing Sheets

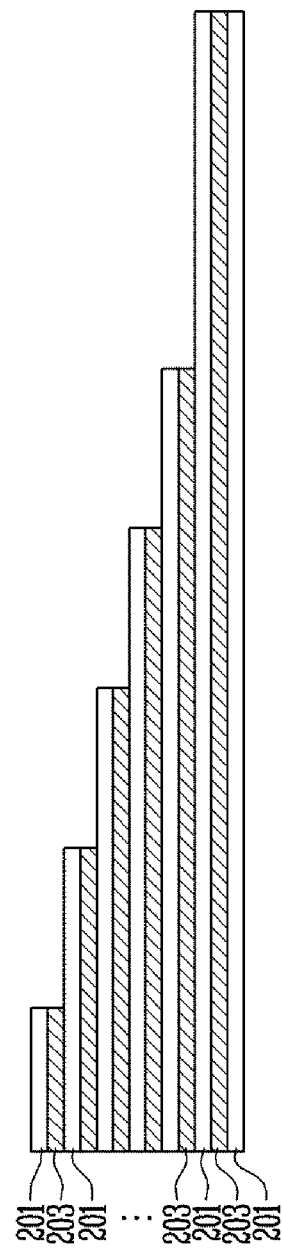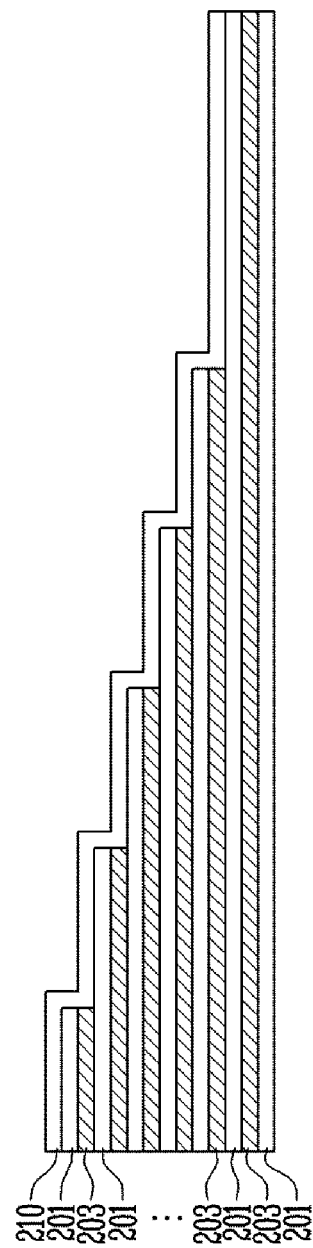

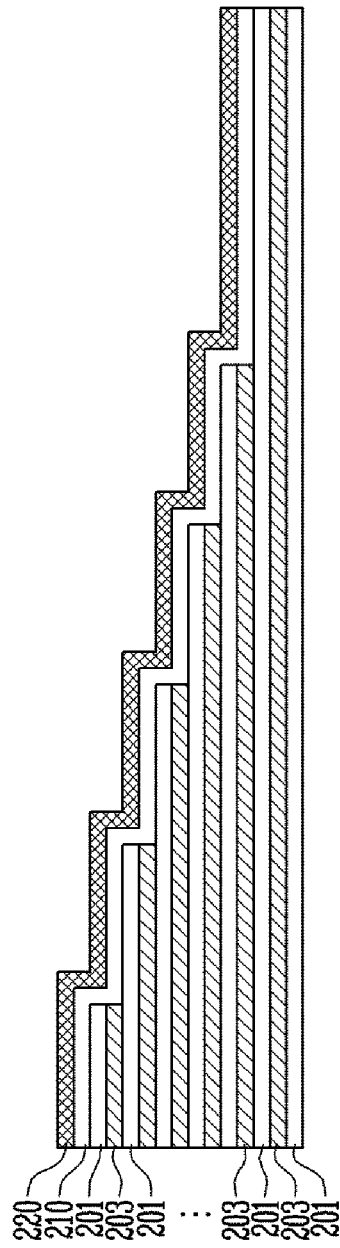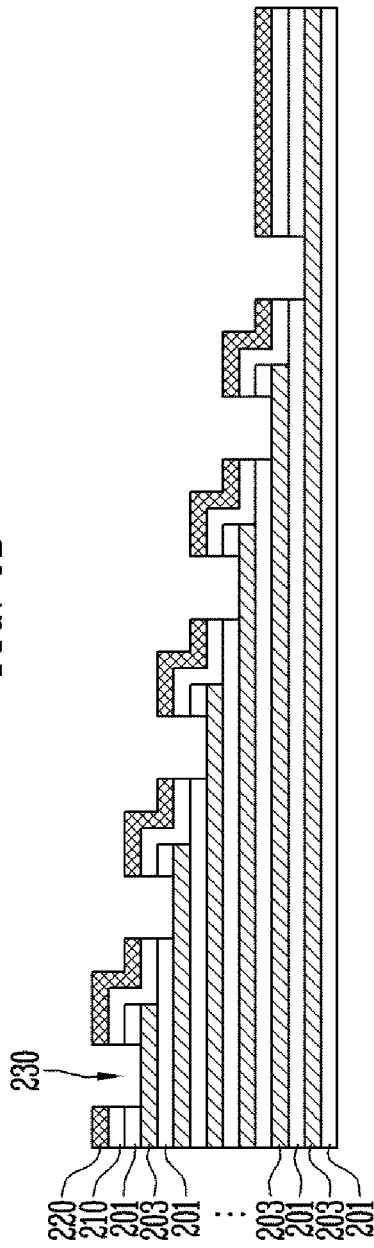

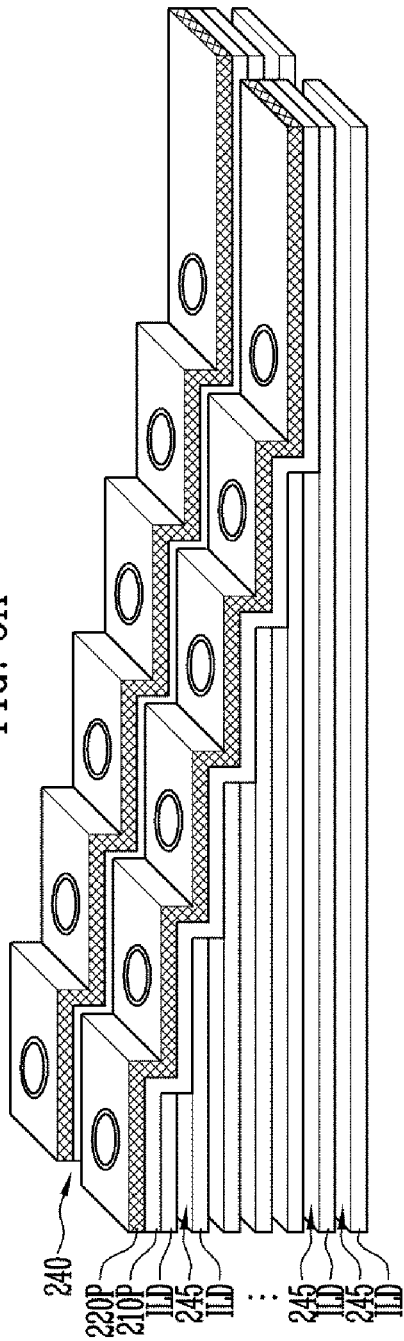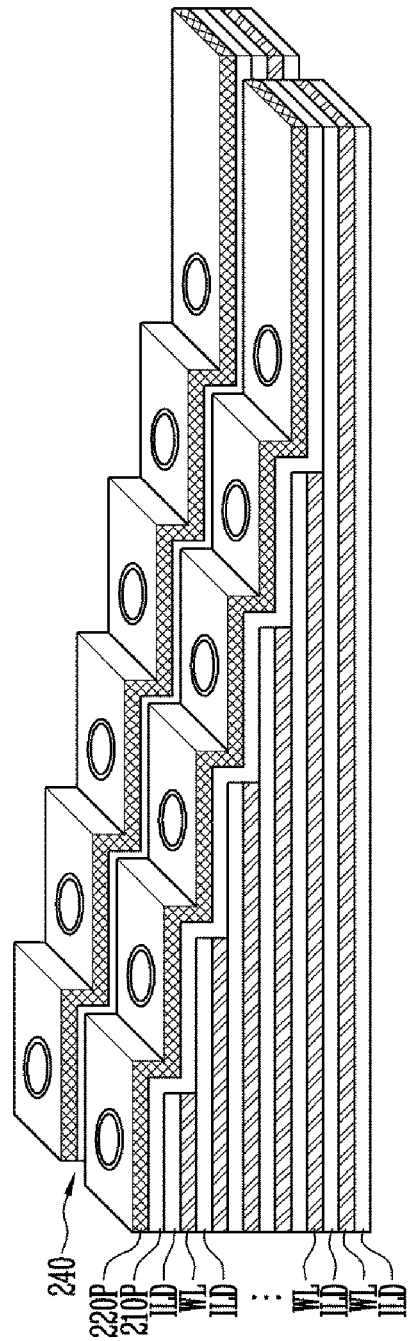

SEMICONDUCTOR DEVICE AND METHOD OF MANUFACTURING THE SAME

CROSS-REFERENCE TO RELATED APPLICATION

The present application claims priority to Korean patent application number 10-2014-0008260 filed on Jan. 23, 2014, in the Korean Intellectual Property Office, the entire disclosure of which is incorporated by reference herein.

BACKGROUND

1. Technical Field

The invention generally relates to a semiconductor device and a method of manufacturing the same, and more particularly, to a memory device and a method of manufacturing the same.

2. Related Art

A semiconductor device includes a memory device capable of storing data. The memory device may include memory blocks, a word line decoder, and local word line selection units.

Each of the memory blocks includes memory strings. Each of the memory string includes serially connected memory cells. Gates of the memory cells are connected to local word lines.

The word line decoder applies operation voltages to global word lines in response to a row address signal.

The local word line selection units are connected to the memory blocks, respectively. Each of the local word line selection units transmits the operation voltages applied to the global word lines in response to a block selection signal to the local word lines of the memory blocks.

SUMMARY

Various technologies for improving integration of the aforementioned memory device have been developed. For example, a method of improving integration by 3-dimensionally arranging the memory cells configuring each of the memory strings has been suggested. In a case where wires of the local word line selection unit is configured in accordance with a 3-dimensional memory string structure, a layout of wires of a peripheral circuit including the local word line selection unit becomes complex, so that a level of difficulty of a manufacturing process of a 3-dimensional semiconductor device is increased.

An embodiment of the present invention may provide a semiconductor device, including interlayer insulating patterns and local word lines which are alternately stacked to form a stepped structure, and a first insulating layer formed on a surface of the stepped structure. The semiconductor device may also include a word line selection gate formed along a surface of the first insulating layer, and active patterns passing through the word line selection gate and the first insulating layer, and connected to the local word lines, respectively.

An embodiment of the present invention may provide a method of manufacturing a semiconductor device, including alternately stacking first material layers and second material layers, and forming a stepped structure by patterning the first material layers and the second material layers. The method of manufacturing the semiconductor device may also include forming a first insulating layer along a surface of the stepped structure, forming a third material layer along a surface of the first insulating layer, and forming active holes passing through the third material layer and the first insulating layer to expose the second material layers, respectively. Additionally, the method of manufacturing the semiconductor device may include forming active patterns connected to the second material layers inside the active holes, respectively.

In an embodiment of the present invention, a semiconductor device may include first material layers and second material layers which are alternately stacked to form a stepped structure, and a first insulating layer formed on a surface of the stepped structure. The semiconductor device may also include a third material layer formed along a surface of the first insulating layer, and active patterns passing through the third material layer and the first insulating layer to connect to the second material layers, respectively.

BRIEF DESCRIPTION OF THE DRAWINGS

FIGS. 3A-3E to 4-6 are diagrams illustrating representations of methods of manufacturing the semiconductor device according to an embodiment.

DETAILED DESCRIPTION

Hereinafter, an embodiment of the present invention will be described with reference to the accompanying drawings in detail. However, the present invention is not limited to an embodiment disclosed below and may be implemented in various forms and the scope of the present invention is not limited to the following embodiments. Rather, the embodiment is provided to more sincerely and fully disclose the present invention and to completely transfer the spirit of the present invention to those skilled in the art to which the present invention pertains, and the scope of the present invention should be understood by the claims of the present invention.

Various embodiments may provide for a semiconductor device that may be capable of simplifying a layout of wires configuring a peripheral circuit. Additionally, various embodiments may provide a method of manufacturing a semiconductor device that may be capable of simplifying a layout of wires configuring a peripheral circuit.

According to various embodiments, the active patterns and the gates of the transistors configuring the peripheral circuit may be disposed along the stepped structure in which the local word lines are formed in a stacked structure. In these embodiments, the area occupied by the peripheral circuit may be decreased.

Further, according to various embodiments, the transistors configuring the peripheral circuit may be disposed in the stepped structure. In these embodiments, by disposing the wires connected to the transistors in the stepped structure a simplified layout may be created.

Figure 1:
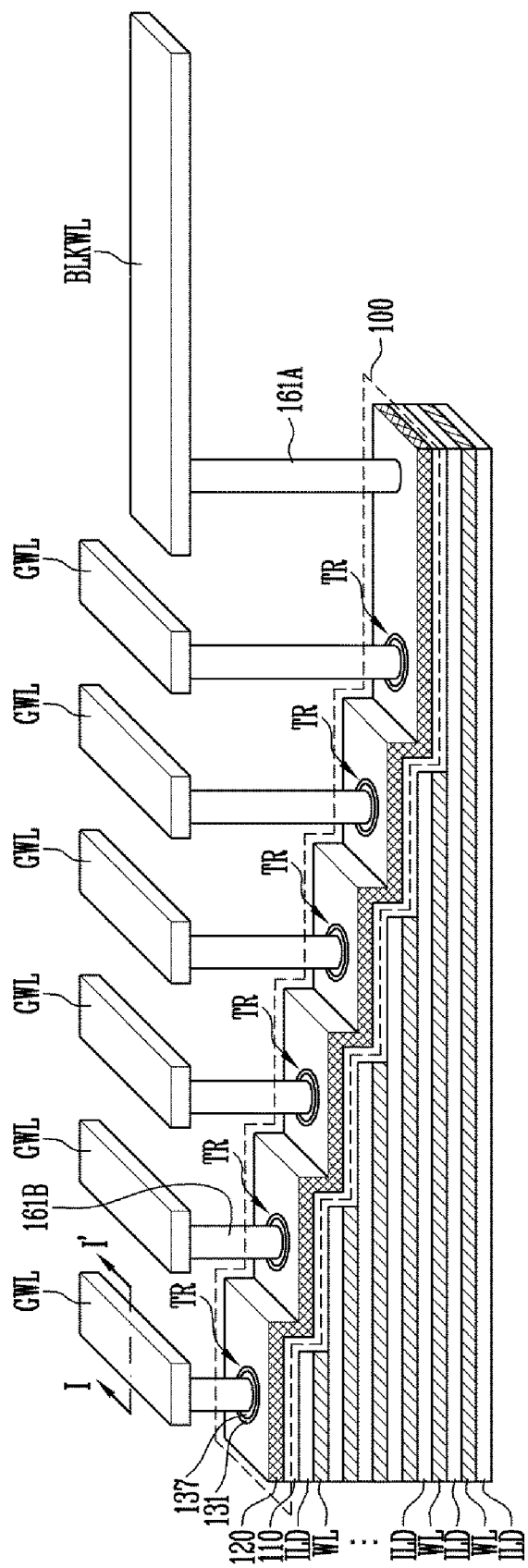
FIG. 1 is a perspective view illustrating a representation of a semiconductor device according to an embodiment.

FIG. 1 is a perspective view illustrating a representation of a semiconductor device according to an embodiment. More particularly, FIG. 1 illustrates a semiconductor device mainly with a region in which a local word line selection unit of the semiconductor device according to an embodiment is formed.

Referring to FIG. 1, the semiconductor device according to an embodiment may include interlayer insulating patterns ILD and local word lines WL which may be alternately stacked, and a local word line selection unit 100 formed along surfaces of partial regions of the interlayer insulating patterns ILD and the local word lines WL.

The alternately stacked interlayer insulating patterns ILD and local word lines WL may include a cell array region (not shown) in which the memory cells are disposed, and a slimming region extended from the cell array region. The slimming region extended from the cell array region may be patterned as a stepped structure. The interlayer insulating patterns ILD and the local word lines WL may be elongated from the cell array region to the slimming region to be close to a lower portion to form the stepped structure. In the cell array region, the local word lines WL may be connected to the memory cells stacked in a 3-dimensional structure. The number of stacks of local word lines WL may be variously changed according to the number of stacks of memory cells stacked in the cell array region.

The local word line selection unit 100 may include pass transistors TR formed along the surface of the stepped structure of the interlayer insulating patterns ILD and the local word lines WL. The pass transistors TR may be connected to the local word lines WL, respectively, to configure the peripheral circuit. Gates of the pass transistors TR may be commonly connected to a word line selection gate 120. The word line selection gate 120 may be formed on an insulating layer 110 formed along the surface of the stepped structure. The word line selection gate 120 may be formed on a surface of the insulating layer 110.

The word line selection gate 120 may be connected to a block word line BLKWL. The block word line BLKWL may be disposed on the word line selection gate 120. A first contact plug 161A may be formed between the block word line BLKWL and the word line selection gate 120. The word line selection gate 120 may be connected to the block word line BLKWL via the first contact plug 161A. A block selection signal may be applied to the block word line BLKWL.

Active patterns 137 of the pass transistors TR are connected to the local word lines WL, respectively. That is, one of the active patterns 137 may be connected to one of the local word lines WL corresponding thereto. Gate insulating layers 131 are further formed between the active patterns 137 and the local word lines WL. The active patterns 137 may be disposed on the local word lines WL. Also, the bottom surfaces of the active patterns 137 may be connected to the local word lines WL.

The local word lines WL are connected to global word lines GWL via the active patterns 137. The global word lines GWL may be disposed over or above the active patterns. In an embodiment where the global word lines GWL are disposed over or above the active patterns, second contact plugs 161B may be formed between the global word lines GWL and the active patterns 137. The global word lines GWL may be connected to the active patterns 137 via the second contact plugs 161B. Operation voltages may be applied to the global word lines GWL. Since the active patterns 137 may be formed in the stepped structure, the second contact plugs 161B may be formed to have different lengths so as to be connected to the active patterns 137 disposed at different heights.

The aforementioned global word lines GWL and block word line BLKWL may be formed at the same height or substantially the same height. In these cases, the global word lines GWL may be extended in a different direction from that of the block word line BLKWL so as to prevent the global word lines GWL from being connected with or in contact with the block word line BLKWL. For example, the global word lines GWL may be extended in an extension direction of the local word lines WL, and the block word line BLKWL may be extended in a different direction from that of the local word lines WL.

According to the aforementioned structures, the pass transistors TR may be defined in cross portions of the active patterns 137 and the word line selection gate 120. The pass transistors TR may be turned on according to the block selection signal applied to the block word line BLKWL, so that the operation voltages applied to the global word lines GLW are transmitted to the local word lines WL.

Figure 2:
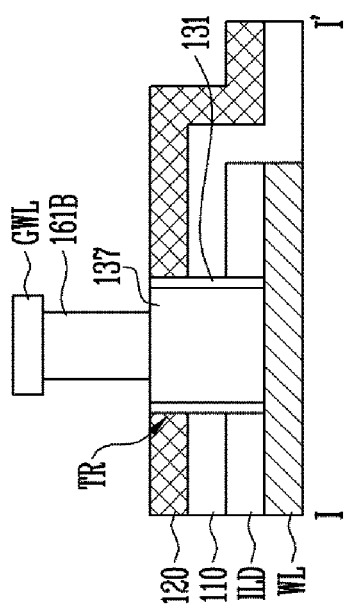
FIG. 2 is a cross-sectional view of a representation of a pass transistor of the semiconductor device taken along line I-I' of FIG. 1.

FIG. 2 is a cross-sectional view of a representation of the pass transistor of the semiconductor device taken along line I-I' of FIG. 1. Hereinafter, a structure of the active patterns 137 will be described with reference to FIG. 2.

Referring to FIG. 2, the active patterns 137 pass through the word line selection gate 120 and the insulating layer 110 to be extended to the surfaces of the local word lines WL. When the interlayer insulating patterns ILD are disposed between the local word lines WL and the insulating layer 110, the active patterns 137 further pass through the interlayer insulating patterns ILD to be connected to the local word lines WL. The gate insulating layers 131 may be formed to surround the sidewalls of the active patterns 137. The word line selection gate 120 may surround the active patterns 137 surrounded by the gate insulating layers 131.

As described above, according to an embodiment, the active patterns 137 and the word line selection gate 120 of the local word line selection unit 100 configuring the peripheral circuit may be formed along the stepped structure formed of the interlayer insulating patterns ILD and the local word lines WL, thereby decreasing an area occupied by the peripheral circuit. Further, according to an embodiment, the pass transistors TR configuring the local word line selection unit 100 may be disposed along the stepped structure, so that it may be possible to dispose the global word lines GWL and the block selection word line BLKWL connected to the pass transistors TR on the stepped structure in a simple layout. Accordingly, the present invention may simplify a manufacturing process of the semiconductor device.

In an embodiment of the present invention, a method of manufacturing a semiconductor device may comprise alternately stacking first material layers and second material layers, forming a stepped structure by patterning the first material layers and the second material layers, forming a first insulating layer along a surface of the stepped structure, forming a third material layer along a surface of the first insulating layer, and forming active holes passing through the third material layer and the first insulating layer to expose the second material layers, respectively. Additionally, the method of manufacturing a semiconductor device may comprise forming active patterns connected to the second material layers inside the active holes, respectively.

The method of manufacturing a semiconductor device may further comprise forming gate insulating layers along sidewalls of the active holes, respectively, before the forming of the active patterns.

The first material layers are formed of an insulating material, and the second material layers and the third material layer are formed of a conductive material. The first material layers are formed of an insulating material, the second material layers are formed of a sacrificial material, and the third material layer is formed of a conductive material.

The method of manufacturing a semiconductor device may further comprise forming a slit passing through the third material layer, the first insulating layer, the first material layers, and the second material layers, forming recess regions by removing the second material layers formed of the sacrificial material through the slit, and filling the recess regions with a conductive material.

The method of manufacturing a semiconductor device may further comprise forming a second insulating layer substantially covering the active patterns, the third material layer, and the stepped structure, forming a first contact hole exposing the third material layer by etching the second insulating layer, forming a first contact plug connected to the third material layer by filling a conductive layer inside the first contact hole, and forming a block word line connected to the first contact plug.

The method of manufacturing a semiconductor device may further comprise forming second contact holes passing through the second insulating layer to expose the active patterns, respectively. Additionally, the method of manufacturing a semiconductor device may comprise forming second contact plugs connected to the active patterns, respectively, by filling a conductive layer inside the second contact holes. Thereafter, the method of manufacturing a semiconductor device may comprise forming global word lines connected to the second contact plugs.

FIGS. 3A to 3E are cross-sectional views illustrating a representation of a manufacturing method of the semiconductor device according to an embodiment. FIGS. 3A to 3E mainly illustrate the slimming region in which the local word line selection unit is formed.

Referring to FIG. 3A, the first material layers 201 and second material layers 203 are alternately stacked. The number of layers of the first material layers 201 and the second material layers 203 may be variously set. The first material layers 201 and the second material layers 203 may include the cell array region (not shown) and the slimming region, and may be formed on a substrate (not shown).

Referring to FIG. 3A, the first material layers 201 and second material layers 203 are alternately stacked. The number of layers of the first material layers 201 and the second material layers 203 may be variously set. The first material layers 201 and the second material layers 203 may include the cell array region (not shown) and the slimming region, and may be formed on a substrate (not shown).

The first material layers 201 may be formed on layers on which the interlayer insulating patterns are to be formed. The second material layers 203 may be formed on layers on which the local word lines are to be formed. The second material layers 203 may be formed of a different material of that of the first material layers 201. More particularly, the second material layers 203 may be formed of a material having etching selectivity for the first material layers 201. For example, the first material layers 201 may be formed of an insulating material for an interlayer insulating pattern, and the second material layers 203 may be formed of a conductive material for the local word line. Otherwise, the first material layers 201 may be formed of an insulating material for an interlayer insulating pattern, and the second material layers 203 may be formed of an insulating material for a sacrificial layer. For example, an oxide layer may be used as the insulating material for the interlayer insulating pattern, and a nitride layer having etching selectivity for the oxide layer may be used as the insulating layer for the sacrificial layer. At least one of a polysilicon layer, a metal silicide layer, and a metal layer may be used as the conductive material for the local word line.

After the first material layers 201 and the second material layers 203 are formed, a stepped structure may be formed in the slimming region of the first material layers 201 and the second material layers 203 by patterning the first material layers 201 and the second material layers 203. The stepped structure may be formed by the processes described below.

First, an etching mask (not shown) covering a part of the slimming region and the cell array region is formed. The etch mask may be a photoresist pattern patterned through a photolithography process. Next, at least one first material layer from the topmost layer among the first material layers 201 and at least one second material layer from the topmost layer among the second material layers 203 are etched by using the etching mask as an etching barrier. Next, the size of the etching mask is decreased through etching of the etching mask. Regions that are exposed by the etching mask among the first material layers 201 and the second material layers 203 are etched by using the decreased etching mask as the etching barrier. The etching process of decreasing the size of the etching mask and the process of etching the first material layers 201 and the second material layers 203 are repeatedly performed until the lowest layer among the second material layers 203 is exposed by the etching mask, and the etching mask is removed. Accordingly, the stepped structure formed of the first material layers 201 and the second material layers 203 may be formed in the slimming region.

Although it is not illustrated, before or after the stepped structure is formed, through-holes passing through the first material layers 201 and the second material layers 203 of the cell array region (not shown) and through-structures filled inside the through-holes may be formed. Each of the through-structures may include a channel layer and at least one insulating layer surrounding the channel layer. At least one insulating layer may include any one of a tunnel insulating layer, a data storage layer, and a blocking insulating layer. The data storage layer may be formed to surround the tunnel insulating layer. Also, the blocking insulating layer may be formed to surround the data storage layer. Further descriptions of the through-structures will be described later with reference to FIGS. 7 and 8.

Referring to FIG. 3B, a first insulating layer 210 may be formed along a surface of the stepped structure formed of the first material layers 201 and the second material layers 203. The first insulating layer 210 may be formed of the same insulating material as that of the first material layers 201. For example, the first insulating layer 210 may be formed of an oxide layer.

As illustrated in FIG. 3C, a third material layer 220 is formed along a surface of the first insulating layer 210. The third material layer 220 may be a conductive layer for the word line selection gate, or may be formed of the same material as that of the second material layers 203. For example, the third material layer 220 may be a conductive layer for the word line selection gate including at least one of a polysilicon layer, a metal silicide layer, and a metal layer. In an embodiment, the third material layer 220 may be formed of a sacrificial material having etching selectivity for the first material layers 201.

Referring to FIG. 3D, active holes 230 may be formed through the third material layers 220, first insulating layers 210, and first material layers 201 to expose the second material layers 203. In an embodiment, the active holes 230 may be formed through the third material layers 220 and the first insulating layer 210 to expose the second material layers 203 when the first material layers 201 have not been formed between the first insulating layer 210 and the second material layers 203. Thus, the active holes 230 may expose the second material layers 203. That is, one of the active holes 230 may expose one of the second material layers 203 among the second material layers 203 corresponding to the one of the active holes 230. When the first material layers 201 are further formed between the first insulating layer 210 and the second material layers 203, the active holes 230 may further pass through the first material layers 201 to expose the second material layers 203.

Figure 3E:
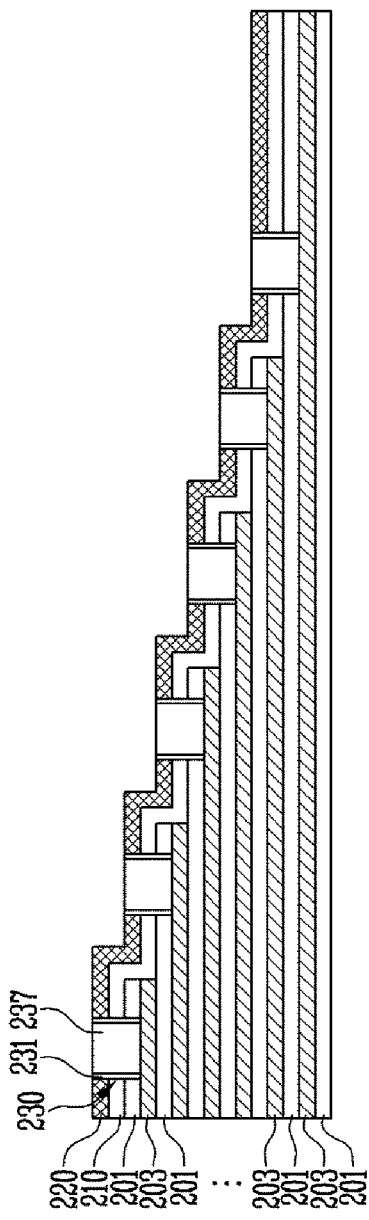

As illustrated in FIG. 3E, gate insulating layers 231 and active patterns 237 may be formed inside the active holes 230. The gate insulating layers 231 may be formed by forming an insulating layer including a silicon oxide layer along surfaces of the active holes 230, and then etching the insulating layer so that bottom surfaces of the active holes 230 are exposed. The etched insulating layer are separated for each active hole 230 to be left as the gate insulating layers 231 along sidewalls of the active holes 230.

The active patterns 237 may be connected to the second material layers 203. The active patterns 237 may be formed by filling inner sides the active holes 230 in which the gate insulating layers 231 are formed with a semiconductor layer. A silicon layer may be used as the semiconductor layer. The active patterns 237 may be formed along surfaces of the gate insulating layers 231 to be formed in a type of a tube of which a center region is open. In an embodiment, the center regions of the tube type active patterns 237 may be filled with an insulating material. In an embodiment, the active patterns 237 may be formed by filling the semiconductor layer all the way through to the center regions of the active holes 230 leaving the center regions of the active patterns filled and not open.

A subsequent process may be variously changed according to properties of the first material layers 201, the second material layers 203, and the third material layer 220.

Figure 4:
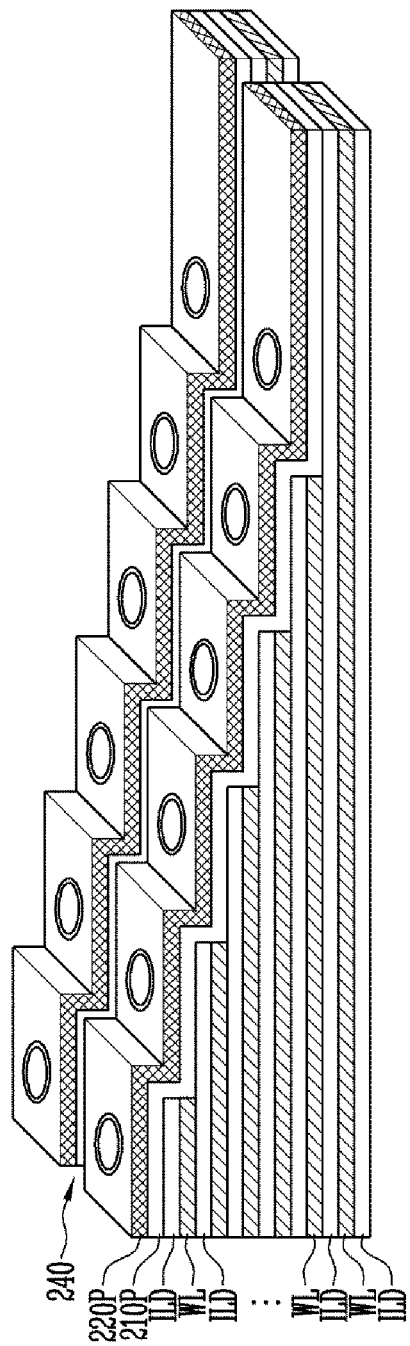

FIG. 4 is a perspective view illustrating a representation of an embodiment of a subsequent process of the process illustrated in FIG. 3E. FIG. 4 illustrates an embodiment, for example, where the first material layers 201 are formed of the insulating materials, and the second material layers 203 and the third material layer 220 are formed of the conductive materials.

Referring to FIG. 4, a slit 240 passing through the third material layer 220, the first insulating layer 210, the first material layers 201, and the second material layers 203 is formed by etching the third material layer 220, the first insulating layer 210, the first material layers 201, and the second material layers 203 illustrated in FIG. 3E. Accordingly, the third material layer 220 may be divided into the word line selection gates 220P by the slit 240. The first insulating layer 210 may be separated into insulating patterns 210P by the slit 240. The first material layers 201 may be separated into the interlayer insulating patterns ILD by the slit 240. The second material layers 203 may be separated into the local word lines WL by the slit 240.

FIGS. 5A and 5B are perspective views illustrating an embodiment of an example of a subsequent process following the process illustrated in FIG. 3E. FIGS. 5A and 5B illustrate an embodiment in which the first material layers 201 are formed of the insulating material, the second material layers 203 are formed of a sacrificial material, and the third material layer 220 is formed of the conductive material.

Referring to FIG. 5A, a slit 240 passing through the third material layer 220, the first insulating layer 210, the first material layers 201, and the second material layers 203 is formed by etching the third material layer 220, the first insulating layer 210, the first material layers 201, and the second material layers 203 illustrated in FIG. 3E. Accordingly, the third material layer 220 may be divided into the word line selection gates 220P by the slit 240. The first insulating layer 210 may be separated into insulating patterns 210P by the slit 240. The first material layers 201 may be separated into the interlayer insulating patterns ILD by the slit 240. The second material layers 203 may be exposed by the slit 240. Then, recess regions 245 are formed between the interlayer insulating patterns ILD by removing the second material layers 203 formed of the sacrificial material through the slit 240.

As illustrated in FIG. 5B, the recess regions 245 illustrated in FIG. 5A are filled with the conductive material. Then, a part of the conductive material formed inside the slit 240 is removed. Accordingly, the local word lines WL filled inside the recess regions 245 and separated by the slit 240 are formed.

Although it is not illustrated in the drawing, when the first material layers 201 illustrated in FIG. 3E are formed of the insulating material, and the second material layers 203 and the third material layer 220 are formed of the sacrificial material, the third material layer 220 may be removed during the process of forming the recess regions 245 aforementioned with reference to FIG. 5A. In this case, the region in which the third material layer 220 is removed may be filled with the conductive material during the process of forming the local word lines WL aforementioned with reference to FIG. 5B. As a result, the word line selection gates 220P separated by the slit 240 may be formed as illustrated in FIG. 5B.

Figure 6:
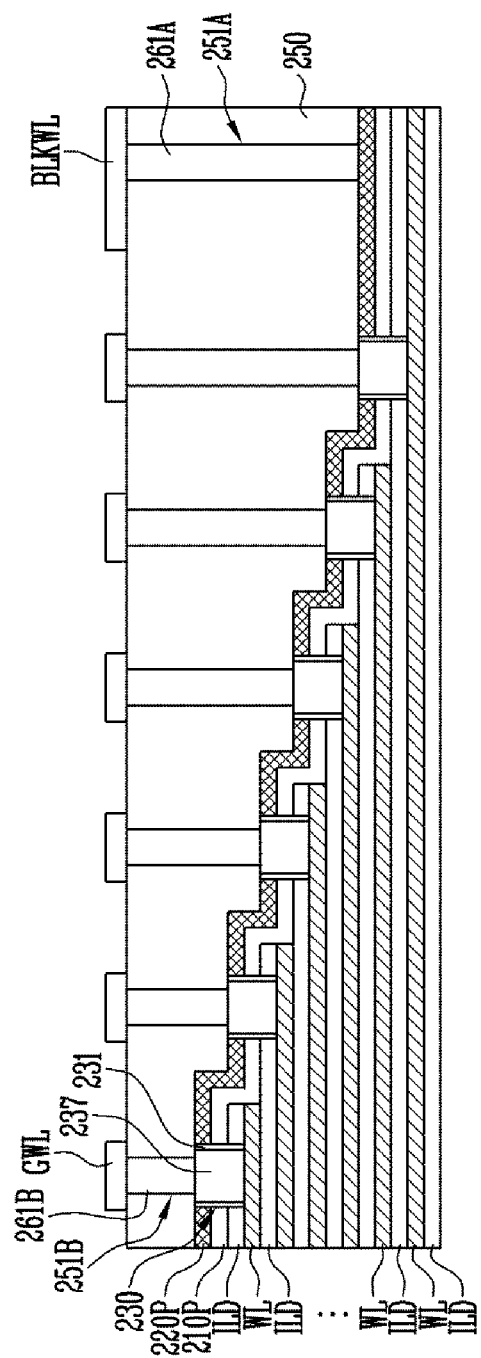

FIG. 6 is a cross-sectional view illustrating an embodiment of a subsequent process following the process illustrated in FIG. 3B.

Referring to FIG. 6, a second insulating layer 250 may be formed to cover the active patterns 237, the word line selection gates 220P, and the stepped structure formed of the interlayer insulating patterns ILD and the local word lines WL. After the second insulating layer 250 is formed, a planarization process for planarizing a surface of the second insulating layer 250 may be further performed. The planarization process may be performed by, for example but not limited to, using a Chemical Mechanical Polishing (CMP) method. The second insulating layer 250 may be formed to fill in the slit 240 illustrated in FIGS. 4 and 5B.

Then, a first contact hole 251A exposing the word line selection gate 220P is formed by etching the second insulating layer 250. Along with forming the first contact holes 251A, the second contact holes 251B exposing the active patterns 237 may also be formed by etching the second insulating layer 250. Next, the first contact hole 251A and the second contact holes 251B may be filled with a conductive material. Accordingly, a first contact plug 261A connected to the word line selection gate 220P is formed, and second contact plugs 261B connected to the active patterns 237, respectively, are formed.

Then, the block word lines BLKWL connected onto the first contact plug 261A and the global word lines GWL connected onto the second contact plugs 261B, respectively, are formed by forming a conductive layer on the second insulating layer 250 and patterning the conductive layer. One side of the block word line BLKWL may be connected to the word line selection gate 220P via the first contact plug 261A, and the other side of the block word line BLKWL may be connected to a block selection switch (not shown) of the peripheral circuit. One side of the global word lines GWL may be connected to the active patterns 237, respectively, via their respective second contact plugs 261B.

Figure 7:
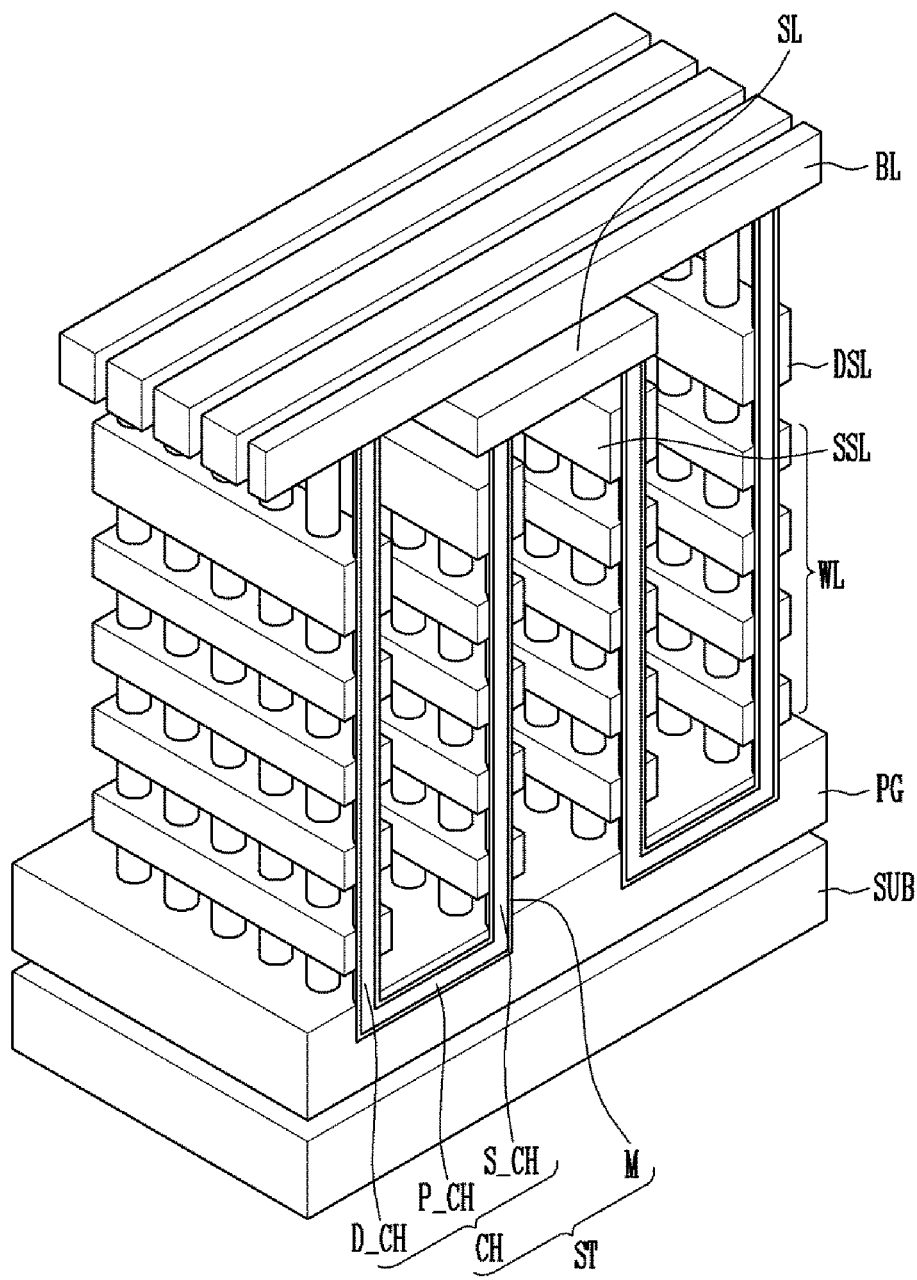
FIGS. 7 and 8 are perspective views illustrating representations of cell structures of the semiconductor device according to an embodiment.
Figure 8:
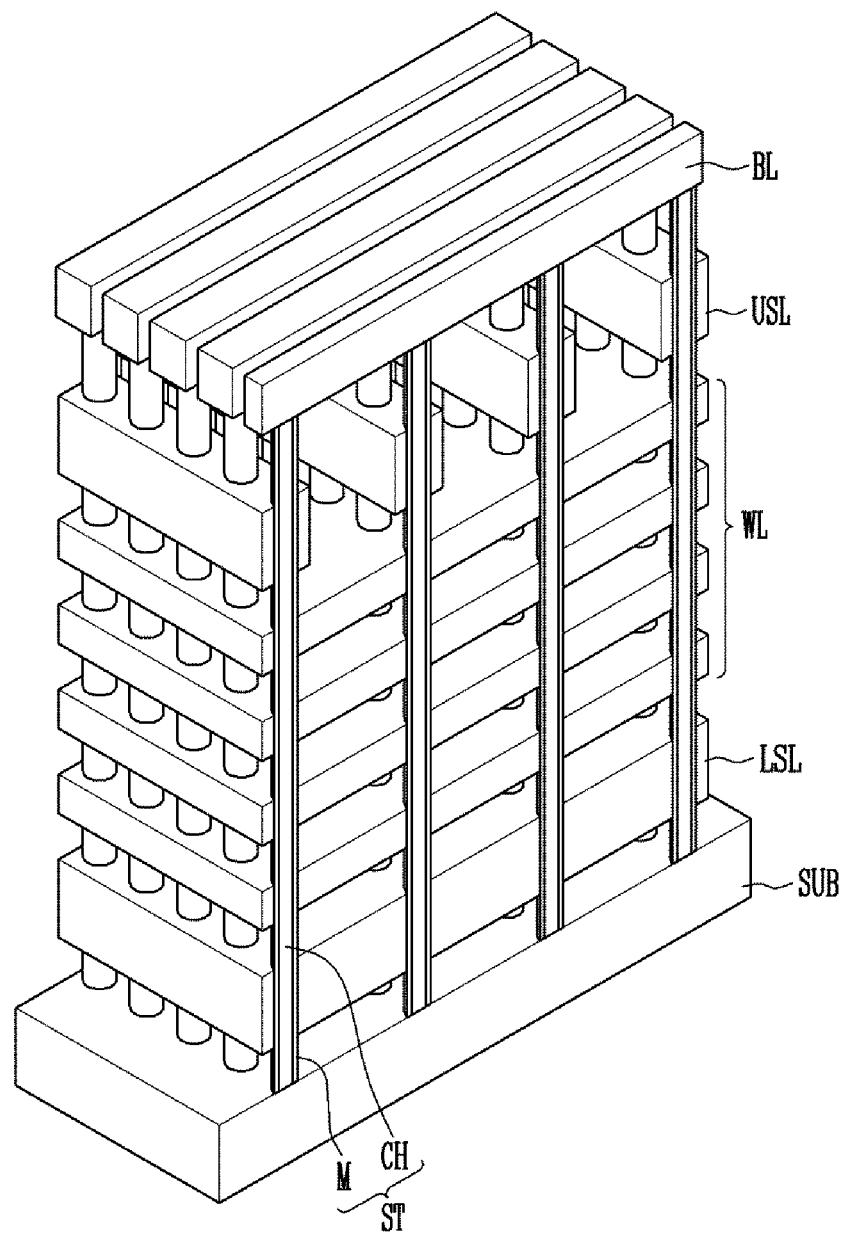

FIGS. 7 and 8 are perspective views illustrating representations of cell structures of the semiconductor device according to an embodiment. Hereinafter, various examples of the embodiments of the cell structure formed in the cell array region will be described with reference to FIGS. 7 and 8.

FIG. 7 illustrates an embodiment in which the memory cells are arranged along a U-shaped through-structure ST to configure a 3-dimensional memory string.

Referring to FIG. 7, a cell structure may include a pipe gate PG, local word lines WL, at least one first selection line SSL, and at least one second selection line DSL stacked on a substrate SUB. The first selection line SSL may be a source selection line, and the second selection line DSL may be a drain selection line.

The cell structure may further include the U-shaped through-structure ST. The through-structure ST includes a channel layer CH and at least one insulating layer M surrounding the channel layer CH. At least one insulating layer M may include any one of a tunnel insulating layer, a data storage layer, and a blocking insulating layer. The data storage layer may be formed to surround the tunnel insulating layer, and the blocking insulating layer may be formed to surround the data storage layer. The tunnel insulating layer includes a silicon oxide layer. The data storage layer includes a silicon oxide layer allowing charge trap. The data storage layer is disposed between the channel layer CH and the local word lines WL. The blocking insulating layer may include at least one of a silicon oxide layer and a high dielectric layer having a higher dielectric constant than that of the silicon oxide.

The channel layer CH includes a pipe channel layer P_CH, and a source side channel layer S_CH and a drain side channel layer D_CH protruding from the pipe channel layer P_CH. FIG. 7 illustrates an embodiment in which one pair of source side channel layer S_CH and drain side channel layer D_CH is connected to the pipe channel layer P_CH. However, the embodiments are not limited in such a way as two or more source side channel layers S_CH may be connected to the pipe channel layer P_CH, and two or more drain side channel layers D_CH may be connected to the pipe channel layer P_CH depending on the form of the memory string.

The source side channel layer S_CH passes through the local word lines WL and the first selection line SSL, and the drain side channel layer D_CH passes through the local word lines WL and the second selection line DSL. The source side channel layer S_CH is connected with a source line SL. The drain side channel layer D_CH is connected with a bit line BL.

According to the aforementioned structure, at least one drain selection transistor, the memory cells, and at least one source selection transistor, which are serially connected, configure one string, and are arranged in a U-shape.

After the pipe gate PG of the aforementioned cell structure is formed, the local word lines WL, at least one first selection line SSL, and at least one second selection line DSL may be formed on the pipe gate PG. The local word lines WL, at least one first selection line SSL, and at least one second selection line DSL may be formed by using the local word line forming processes aforementioned with reference to FIGS. 3A to 5B.

FIG. 8 illustrates an embodiment, for example, in which the memory cells are arranged along a straight through-structure ST to configure a 3-dimensional memory string.

Referring to FIG. 8, a cell structure may include at least one first selection line LSL, local word lines WL, and at least one second selection line USL sequentially stacked on a substrate SUB including a source region. Here, the local word lines WL are formed in a plate form, and at least one of the first and second selection lines USL and LSL may be formed of a line shape. Otherwise, the local word lines WL and the first and second selection lines USL and LSL may be formed of the line form. The cell structure may further include the through-structure ST connected to the substrate SUB to be formed in the straight type.

The through-structure ST includes a channel layer CH and at least one insulating layer M surrounding the channel layer CH. At least one insulating layer M may be formed of the same material as that described with reference to FIG. 7. The channel layer CH may be connected between the substrate SUB and the bit lines BL. Particularly, the channel layer CH may be connected to the source region of the substrate SUB.

According to the aforementioned structure, at least one first selection transistor, the memory cells, and at least one second selection transistor, which are serially connected, configure one string, and are arranged in a row.

At least one first selection line LSL, the local word lines WL, and at least one second selection line USL of the cell structure may be formed by using the local word line forming processes described with reference to FIGS. 3A to 5B.

Figure 9:
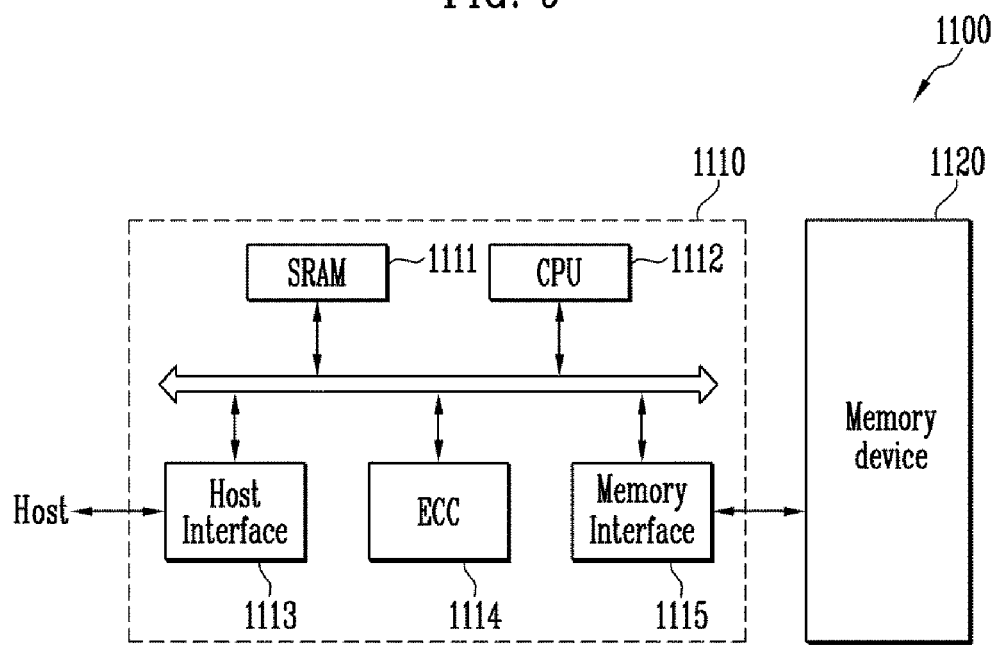
FIG. 9 is a configuration diagram illustrating a representation of a memory system according to an embodiment.

FIG. 9 is a configuration diagram illustrating a memory system according to an embodiment.

Referring to FIG. 9, a memory system 1100 according to the embodiments may include a memory device 1120 and a memory controller 1110.

The memory device 1120 may include the structures of the embodiments described above with reference to FIGS. 1 to 8. Further, the memory device 1120 may be a multi-chip package formed of a plurality of flash memory chips.

The memory controller 1110 may be configured to control the memory device 1120, and may include an SRAM 1111, a CPU 1112, a host interface 1113, an ECC 1114, and a memory interface 1115. The SRAM 1111 may be used as an operational memory of a CPU 1112, the CPU 1112 may perform a general control operations for a data exchange of the memory controller 1110. The host interface 1113 may include a data exchange protocol of a host connected with the memory system 1100. Further, the ECC 1114 may detect and correct an error included in data read from the memory device 1120. The memory interface 1115 may perform interfacing with the memory device 1120. In addition, the memory controller 1110 may further include a ROM for storing code data for interfacing with the host.

As described above, the memory system 1100 including the aforementioned structure may be a memory card or a Solid State Disk (SSD) in which the memory device 1120 is combined with the memory controller 1110. For example, when the memory system 1100 is the SSD, the memory controller 1110 may communicate with an external device (for example, a host) through one of various interface protocols, such as but not limited to USB, MMC, PCI-E, SATA, PATA, SCSI, ESDI, and IDE.

Figure 10:
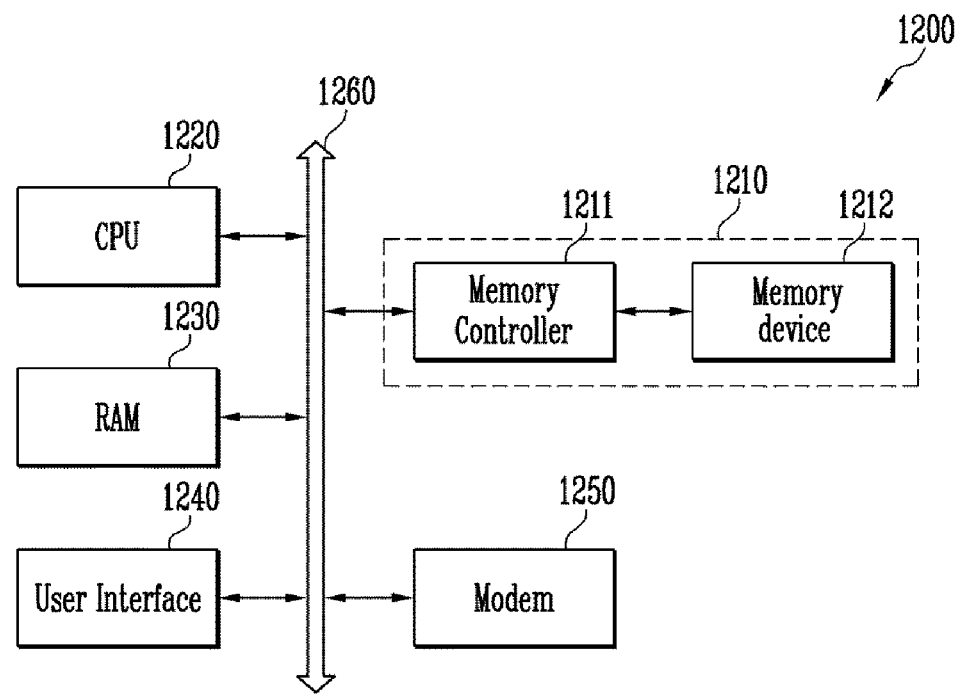
FIG. 10 is a configuration diagram illustrating a representation of a computing system according to an embodiment.

FIG. 10 is a configuration diagram illustrating a computing system according to an embodiment.

Referring to FIG. 10, a computing system 1200 according to the embodiments may include a CPU 1220, a RAM 1230, a user interface 1240, a modem 1250, and a memory system 1210, which are electrically connected to a system bus 1260. Further, in an embodiment where the computing system 1200 is a mobile device, the computing system 1200 may further include a battery for supplying an operational voltage to the computing system 1200, and may further include an application chip-set, a CMOS image sensor CIS, a mobile DRAM, and the like.

The memory system 1210 may be formed of a memory device 1212 and a memory controller 1211 as previously described with reference to FIG. 9.

As described above, the embodiments have been disclosed through the above mentioned drawings and specification. The specific terms used herein are for purposes of illustration, and do not limit the scope of the embodiments. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A semiconductor device, comprising:
   interlayer insulating patterns and local word lines which are alternately stacked, wherein the interlayer insulating patterns and the local word lines extend to a slimming region from a cell array region to form a stepped structure in the slimming region;
   a first insulating layer formed directly in contact with a stepped surface of the stepped structure in the slimming region;
   a word line selection gate formed along the stepped surface of the stepped structure in the slimming region and formed directly in contact with the first insulating layer; and
   active patterns formed directly in contact with the stepped surface and passing through the word line selection gate and the first insulating layer in the slimming region, and connected to the local word lines, respectively.

2. The semiconductor device of claim 1, further comprising:
   gate insulating layers surrounding the active patterns and contacting sidewalls of the active patterns, respectively.

3. The semiconductor device of claim 1, wherein the word line selection gate surrounds the active patterns.

4. The semiconductor device of claim 1, further comprising:
   a block word line; and
   a first contact plug connecting the block word line to the word line selection gate.

5. The semiconductor device of claim 1, further comprising:
   global word lines coupled to the active patterns, respectively.

6. The semiconductor device of claim 5, further comprising:
   second contact plugs formed between the active patterns and the global word lines.

7. The semiconductor device of claim 6, wherein the second contact plugs have different lengths.

8. The semiconductor device of claim 1, further comprising:
   a second insulating layer configured to cover the interlayer insulating patterns, the local word lines, the insulating layer, the word line selection gate, and the active patterns;
   a first contact plug passing through the second insulating layer and connected to the word line selection gate;
   second contact plugs passing through the second insulating layer and connected to the active patterns;
   a block word line formed on the second insulating layer and connected to the first contact plug; and
   global word lines formed on the second insulating layer and connected to the second contact plugs.

9. The semiconductor device of claim 8, wherein the global word lines and the block word line are extended in different directions.

10. The semiconductor device of claim 1, further comprising:
    channel layers that pass through the interlayer insulating patterns and the local word lines in the cell array region; and
    data storage layers formed between the channel layers and the local word lines.

11. The semiconductor device of claim 10, further comprising:
    first selection lines disposed under the local word lines and penetrated by the channel layers; and
    second selection lines disposed on the local word lines and penetrated by the channel layers.

12. The semiconductor device of claim 10, further comprising:
    a pipe channel layer configured to connect at least every two of the channel layers; and
    a pipe gate configured to surround the pipe channel layer.

13. A semiconductor device, comprising:
    first material layers and second material layers which are alternately stacked, wherein the first material layers and the second material layers extend to a slimming region from a cell array region to form a stepped structure in the slimming region;
    a first insulating layer formed directly in contact with a stepped surface of the stepped structure in the slimming region;
       a third material layer formed along the stepped surface of the stepped structure in the slimming region and formed directly in contact with the first insulating layer; and
       active patterns formed directly in contact with the stepped surface and passing through the third material layer and the first insulating layer in the slimming region to connect to the second material layers, respectively.

14. The semiconductor device of claim 13, wherein the third material layer is formed of substantially the same material as that of the second material layers.

15. The semiconductor device of claim 13,
    wherein the first material layers include interlayer insulating patterns,
    wherein the second material layers include local word lines
    wherein the first insulating layer includes insulating patterns, and
    the third material layer includes a word line selection gate.

* * * * *